(12) United States Patent
Fontejon, Jr. et al.

(10) Patent No.: US 7,799,138 B2
(45) Date of Patent: Sep. 21, 2010

(54) IN-SITU METHOD TO REDUCE PARTICLE CONTAMINATION IN A VACUUM PLASMA PROCESSING TOOL

(75) Inventors: Paul Alejon Fontejon, Jr., Pittsburgh, CA (US); Yunxiao Gao, Sunnyvale, CA (US); Yinshi Liu, Foster City, CA (US); Ning Shi, San Jose, CA (US)

(73) Assignee: Hitachi Global Storage Technologies Netherlands, Amsterdam (NL)

( * ) Notice: Subject to any disclaimer, the term of this patent is extended or adjusted under 35 U.S.C. 154(b) by 86 days.

(21) Appl. No.: 11/472,593

(22) Filed: Jun. 22, 2006

(65) Prior Publication Data
US 2007/0295356 A1 Dec. 27, 2007

(51) Int. Cl.
*C25F 3/30* (2006.01)
(52) U.S. Cl. .................. 134/1.1; 134/1.2; 134/1.3; 156/345.35; 15/1.51
(58) Field of Classification Search ............... 134/1.1
See application file for complete search history.

(56) References Cited

U.S. PATENT DOCUMENTS

| | | | |
|---|---|---|---|
| 4,963,239 A * | 10/1990 | Shimamura et al. .... | 204/192.12 |
| 5,304,405 A | 4/1994 | Kobayashi et al. | |
| 5,565,179 A | 10/1996 | Douglas | |
| 5,584,938 A | 12/1996 | Douglas | |
| 5,854,138 A | 12/1998 | Roth et al. | |
| 6,318,384 B1 * | 11/2001 | Khan et al. ................. | 134/22.1 |
| 6,423,176 B1 | 7/2002 | Ito et al. | |
| 6,815,362 B1 * | 11/2004 | Wong et al. .................. | 438/706 |
| 6,905,624 B2 * | 6/2005 | Frum et al. .................... | 216/60 |
| 2003/0003758 A1 * | 1/2003 | Moriya et al. ............... | 438/710 |
| 2004/0011380 A1 * | 1/2004 | Ji et al. ........................ | 134/1.1 |
| 2004/0134768 A1 * | 7/2004 | Wang et al. ............ | 204/192.17 |
| 2004/0137750 A1 | 7/2004 | Nemoto et al. | |
| 2004/0178169 A1 * | 9/2004 | Desphande et al. ........... | 216/12 |
| 2004/0219789 A1 * | 11/2004 | Wood et al. .................. | 438/690 |
| 2005/0112901 A1 * | 5/2005 | Ji et al. ....................... | 438/710 |
| 2005/0130404 A1 * | 6/2005 | Moghadam et al. ......... | 438/623 |

OTHER PUBLICATIONS

Author: David Halliday, Robert Resnick, Jearl Walker; Title: Fundamentals of Physics: Extended Edition; 4th Edition; Publisher: John Wiley & Sons, Inc.; Copyright 1993; pp. 667 and 728.*

* cited by examiner

*Primary Examiner*—Michael Kornakov
*Assistant Examiner*—Eric Golightly
(74) *Attorney, Agent, or Firm*—Maryam Imam; IPxLaw Group LLP (57) ABSTRACT

The method and apparatus of the embodiments of the present invention employ an in-situ particle decontamination technique that allows for such decontamination while a wafer is a vacuum tool or deposition chamber, thereby eliminating the need for another device for performing decontamination. This in-situ decontamination is effective for particle contamination resulting, for example, from tool resident mechanical component. Furthermore, particle decontamination is performed in the presence of plasma, having a potential for helping to maximize a "self bias" voltage, under RF conditions, and is integrated into the vacuum process.

12 Claims, 9 Drawing Sheets

IN-SITU METHOD TO REDUCE PARTICLE CONTAMINATION IN A VACUUM PLASMA PROCESSING TOOL

BACKGROUND OF THE INVENTION

1. Field of the Invention

This invention relates generally to the field of particle decontamination during manufacturing of semiconductor devices, a plurality of which are formed on a wafer, and particularly to a method and apparatus for reducing particle contamination of the wafer while the wafer is in a vacuum, in-situ.

2. Description of the Prior Art

Semiconductor devices are manufactured on a smaller scale due to a variety of recent applications of semiconductor, microelectronic and microelectro-mechanical devices requiring small-scale devices. Small scale device manufacturing further increases the need for wafer decontamination.

During semiconductor device manufacturing, wafers are typically formed in vacuum deposition tools, such as vacuum plasma processing tools, with the wafer being loaded outside of the vacuum and then brought into the vacuum for thin film deposition and various ion etching or other processing. However, the functionality of devices produced by such procedures can be severely impaired if foreign substances, in the form of micro particulate, are contaminating the surface of the wafer. Such contamination usually comes from poor handling and outdated tool design and inadequate manufacturing controls.

In applications, such as magnetic disk recording drives, utilizing microelectromagnetic devices, the presence of undesirable particles on the wafer surface thereof is similarly detrimental in that, for example, if a particle is in line with a critical dimension of a device feature in the recording head (a device used to read and/or write to the magnetic recording disk), the disk drive is essentially rendered inoperational. That is, the head devices on the contaminated wafer are essentially wasted.

Figure 1:
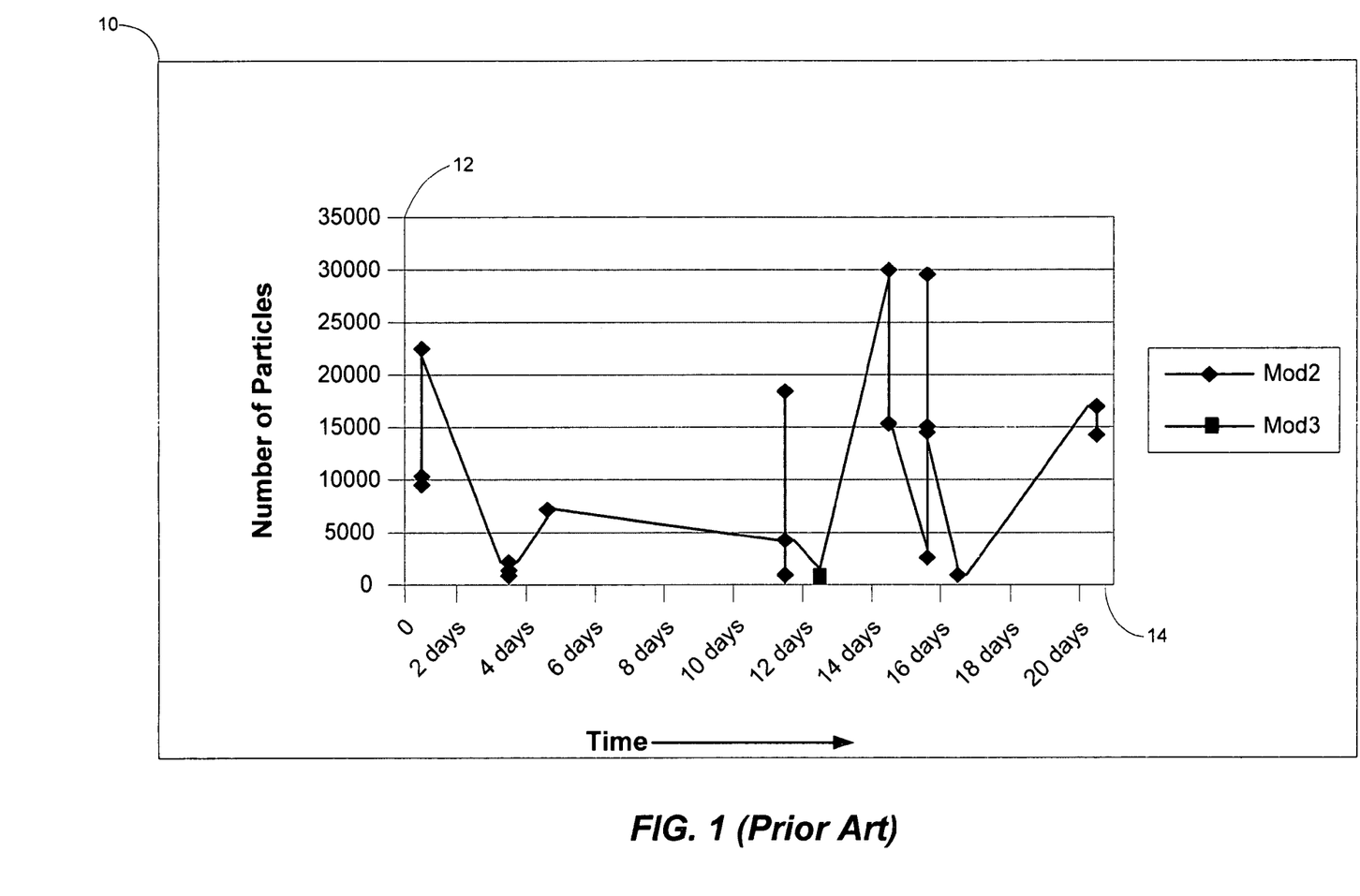
FIG. 1 shows a graph of a prior art technique for occurrence of particle contamination in arbitrary units, as shown by the y-axis, versus time, as shown by the x-axis, for a wafer being 5 inches in diameter, when, for example, a tool is malfunctioning and no in-situ particle control is in place.

For a better understanding, an extreme case is shown here on the wafer particle contamination. FIG. 1 shows a graph 10 of prior art problems, such as particle signal multiplication occurrence due to malfunctions of tool-resident mechanical components. This graph depicts the impact of an unintended internal particle source. All prior art methods, since they are ex-situ standing-alone non-integrated methodologies, are "upstream" and ineffective. Particle contamination, as shown by the y-axis 12, is shown against chronology, as shown by the x-axis 14, for a wafer being 5 inches in diameter. Multiplication of particle contamination introduces particles into the critical dimension of heads of disk drives essentially reduces yield and raises manufacturing unit costs.

Prior art technology has attempted to reduce wafer contamination. For example, electrostatic decontamination devices are utilized but no method or apparatus offers decontamination to take place directly within the vacuum tool or in-situ. The prior art electrostatic decontamination devices typically have two gas flow openings, one is referred to as inlet and the other is referred to as outlet. Flow of gas, which is needed for decontamination, requires pressure differential. With help of electrostatic charge, particles are "lifted" and "vacuumed" into a particle collector by the presence of gas flow. However, this technique, firstly, requires a separate device, i.e. the electrostatic decontamination device and secondly gas flow is required to blow particles. The disadvantage of such ex-situ particle reduction devices is that the method is useless for contamination from an internal source such as a malfunctioning vacuum deposition tool (e.g. during wafer mechanical transferring between process modules). That is, it is vacuum incompatible. The state-of-the-art recording head processing technology, and microelectronic processing, in general, calls for multi-layer and multi-module processing cluster equipment with integrated complex mechanical systems, which increase exposure to in-situ contamination due to increased frequency of wafer in situ mechanical handling. Such limitation of prior art ex-situ particle decontamination devices is therefore inadequate in reducing such contamination related yield and reliability problems. The only viable solution to such problem is increased tooling, renewal and increase in maintenance frequency resulting in increased productivity costs and cycle time. The challenge is then to reduce or ideally eliminate particle contamination while in-situ in vacuum, and perhaps utilizing existing vacuum tools without modification thereto.

In summary, in prior art techniques, a particle ionizing device is employed for decontamination of the surface of the wafer, however, this is a stand-alone device specifically designed for particle contamination and requiring added steps for this purpose, and is only good for decontamination of upstream ex-situ sources.

Thus, in light of the foregoing, there is a need for a wafer decontamination method and apparatus compatible with vacuum processing requirement and integrated into microelectronic thin film processing tools.

SUMMARY OF THE INVENTION

Briefly, one embodiment of the present invention includes employing an in-situ particle decontamination technique that allows for such decontamination using existing plasma processing equipment without breaking vacuum. This, thereby, supplements to the need for another device for performing decontamination and enables in-situ decontamination prior to functional plasma processing without breaking vacuum. An embodiment of the present invention is a method to decontaminate using an RF diode configuration. Particle decontamination is performed in the presence of an RF plasma, with a maximized substrate "self bias" voltage. The negatively charged particles are propelled by the coulomb electrostatic forces from similarly charged substrate. The particles are further driven away by the plasma potential gradient near plasma-substrate interface.

DETAILED DESCRIPTION OF THE PREFERRED EMBODIMENT

The embodiments of the present invention include a methodology to decontaminate particles in-situ without interrupting vacuum processing and can therefore be used to safeguard against yield detractors resulting from internal particle source inside of a vacuum tool or chamber. The methodology takes advantage of particle-substrate electrostatic Coulomb interaction as well as plasma glow characteristics. The principle is taught using examples from vacuum processing equipment with RF capabilities such as an RF diode sputtering system. Substrate is RF powered such that the self bias voltage is maximized. The charged particles are repelled by the Coulomb electro-static force and plasma potential gradient. However, this principle can be applied to other relevant vacuum technologies.

Figure 2:
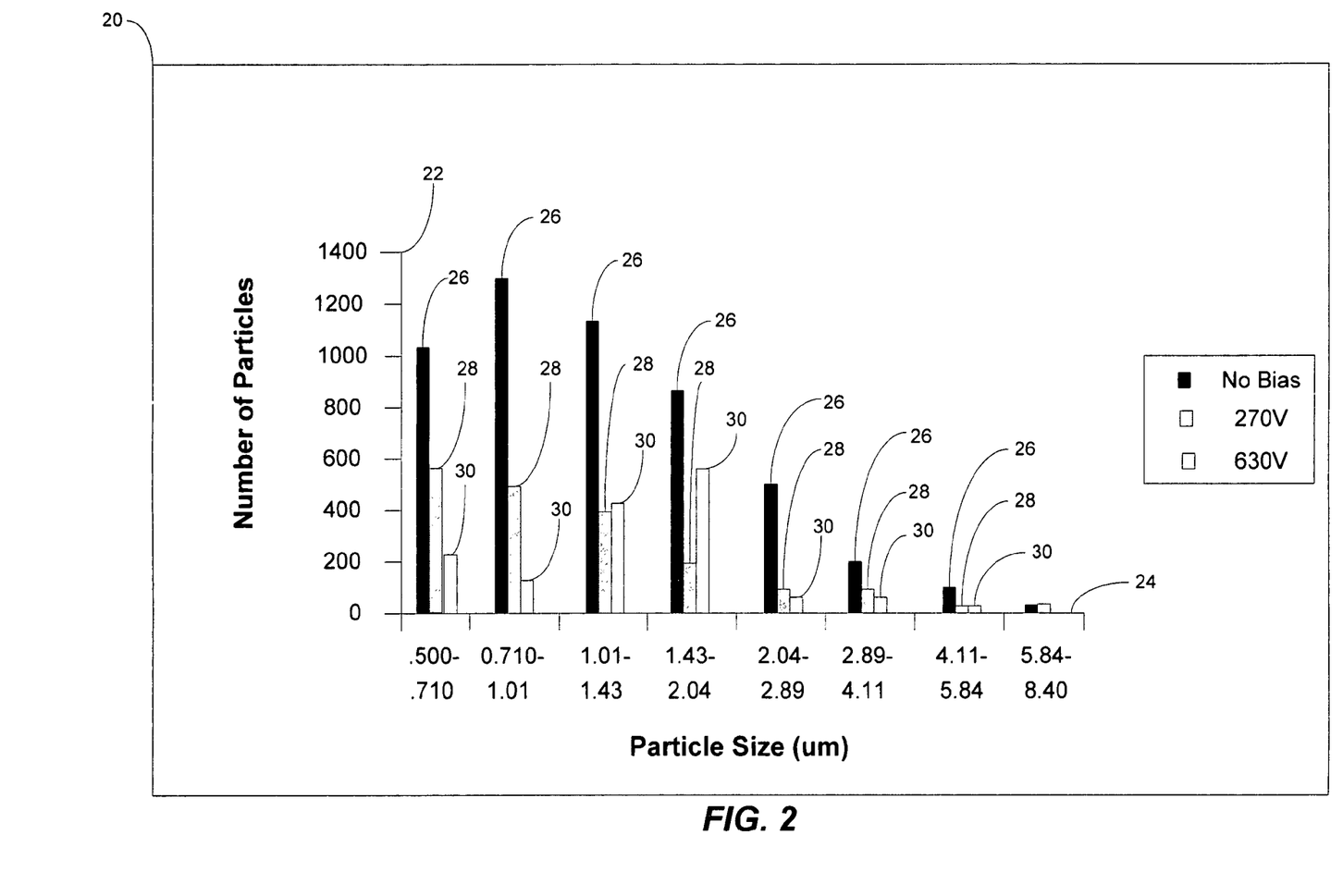
FIG. 2 shows a graph of an example of particle size distribution with and without present particle decontamination technique.

Referring now to FIG. 2, a graph 20 is shown of an example of a relationship between the particle vs. particle size when methods and apparatus of the present invention are employed. Ar is used as a working gas and in-situ control is in effect as compared to prior art lack of in-situ control when a resident tool mechanical component malfunctions to shed particles. The x-axis 24 represents the particle size (in micrometers), in a range of sizes and the y-axis 22 represents the number of particles for when in-situ particle decontamination is not applied, irrespective of any application of prior art ex-situ methods, as shown in dark or black-colored bars at 26; and for when methods of the present invention are applied, as shown by 28 and 30. That is, a process module substrate bias of 270 Volts is introduced, shown in lighter-colored bars at 28 and for when a bias of 630 Volts is applied, shown by no-colored bars at 30. In the case of no in-situ decontamination, or the bars at 26, no substrate electrical charge is induced by bias, while at 30, the most or highest bias voltage is applied and at 28, a somewhat less bias voltage between no biasing and the highest bias is applied. The role of self-biasing is to negatively charge both the substrate and the particles on top of the substrate. The teachings of the present invention achieve the desired reduction of particle contamination at 30.

Clearly, the number of particles is drastically reduced in the cases at 28 and 30, where some kind of bias is introduced, for reasons which will become apparent shortly. In the present invention, radio frequency (RF) is maximized for self-biasing, which is better understood with a later discussion of FIG. 6. To maximize RF self bias, where particles and the plate, which includes one or more wafers, the particles and the plate are charged with the same sign (electrons), thus, the particles are repelled off of the wafer and further accelerated into the plasma by the plasma potential gradient near substrate interfaces (so called dark space and sheath). The RF plasma is generated by the vacuum processing tool (as so designed to do), only that the characteristics will be customized during such particle contamination reduction. For example, to maximize the effect, plate voltage (self-bias) needs to be maximized.

Figure 3:
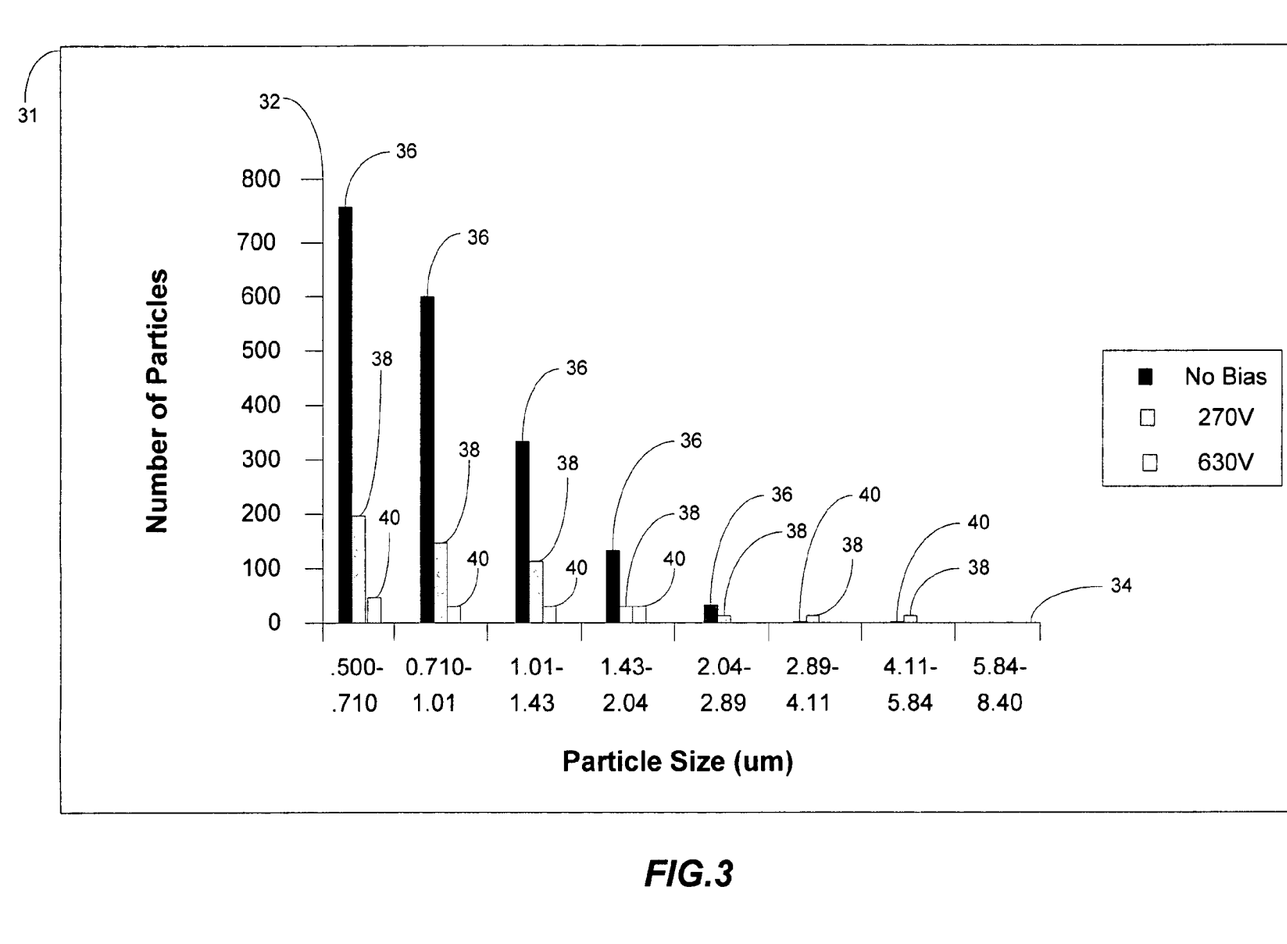
FIG. 3 shows a graph of another example of particle size distribution with and without present particle decontamination technique.

FIG. 3 shows a graph 31 of another example of particle size when methods and apparatus of the present invention are employed. The x-axis 34 represents the particle size (in micrometers), in a range of sizes and the y-axis 32 represents the number of particles for when no bias is applied and shown in dark or black-colored bars at 36 and for when a process plasma and substrate bias is introduced, shown in lighter-colored bars at 38 and for when a bias of 630 Volts is applied, shown by no-colored bars at 40. In the case of no plasma and no bias, or the bars at 36, no electrical charge is induced, i.e. no biasing occurs, while at 40, the most or highest electrical charge is applied and at 38, a charge of somewhere between no biasing and the highest electrical charge is applied. The graphs of FIGS. 2 and 3 differ in that they represent values experienced using two different example vacuum tools both containing unintended internal particle sources.

Clearly, the number of particles is drastically reduced in the cases at 38 and 40, where plasma is ignited and some kind of bias is introduced, for reasons which will become apparent shortly. The teachings of the present invention achieve the desired reduction shown at 40. Thus, generally, the greater the bias voltage, the less and smaller the particles remains.

Figure 4:
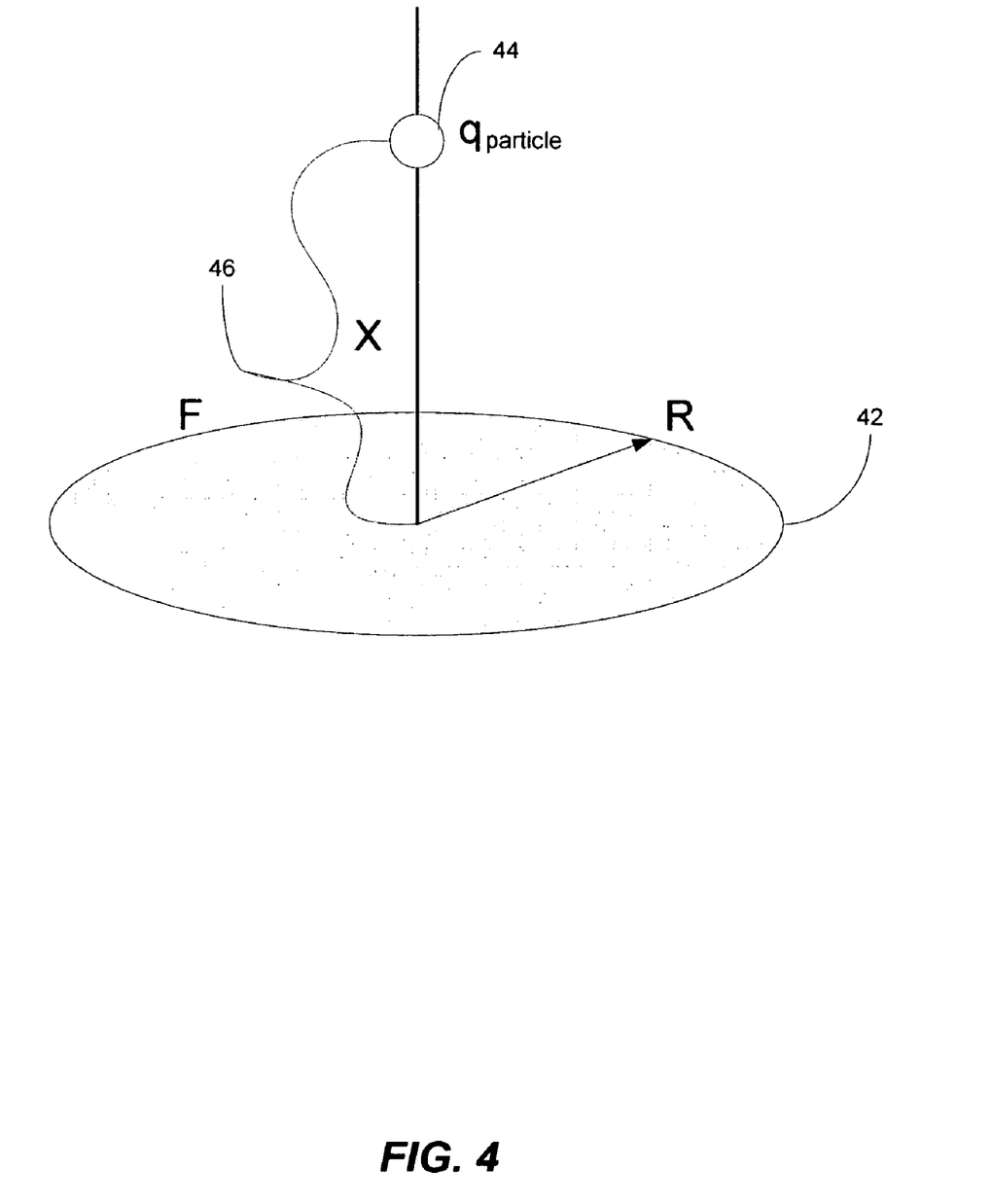
FIG. 4 shows a plate with a charged particle, $q_{particle}$, located at a distance X above the plate wherein a force, F, represents the force between the charged particle and the plate.

FIG. 4 shows a plate 42 with a charged particle 44, $q_{particle}$, located at a distance X above the plate 42 wherein a force 46, F, represents the force between the charged particle 44 and the plate 42. The latter two are electrostatically charged the same, that is, they are either charged negatively or positively with the same sign, thereby repelling each other. R is the radius of the plate 42. Repelling of the particle causes reduced particle contamination of the wafer surface, as represented by the plate 42. The electrostatic force F, from the charge on the plate 42, is proportional to the square of the voltage of the plate 42 and its equation is as follows:

$$F = E_{plate} q_{particle} \quad \text{Eq (1)}$$

$$= -\frac{2\pi r_{particle}^2 \sigma^2}{\varepsilon_0}$$

$$= 8\pi\varepsilon_0 V_{plate}^2 \left(\frac{r_{particle}}{R}\right)^2 \propto V_{plate}^2$$

Wherein $\sigma_{particles}$ represents charge density and is assumed the same for plate and particles, $V_{plate}$ is the voltage applied to the plate 42, i.e., bias voltage, $\varepsilon_0$ represents permittivity constant and $r_{particle}$ represents the radius of the particle 44, $E_{plate}$ represents electric field of the plate and $q_{particle}$ is the electrostatic charge of the particle. It is to be noted that the repulsive force, F, is proportional to the square of bias voltage, $V_{plate}$, and inversely proportional to the plate diameter that is charged and holding device substrate. That is, to maximize the decontamination effect, maximizing bias voltage is an effective parameter; and the smaller the plate, the more effective the decontamination from electrostatic charging. The charge density, $\sigma_{particle}$, presently assumed the same as that of plate/substrate is likely an underestimation for irregular shape of particles may induce singularities and antenna effect and more charge accumulation, so to increase repulsive force.

In one embodiment, the plate 42 is made of metal. In a system where the plate is configured below plasma, portions of particles could settle back onto the wafer through gravitational force. A metal substrate holder could help in that it has a fast time constant resulting in a fast discharge effect when the plasma is switched off in the vacuum tool in which wafer underwent particle reduction. The wafer itself, however, has a dielectric insulation layer resulting in the charge accumulation, i.e. the charge on the wafer remaining negative, longer than that of the surrounding metal plate. This, in effect, diverts the still suspended particles from settling back onto the wafer due to the same electrostatic repulsive force. For this to happen, process pressure should remain low to reduce the probability of charge annihilation (see below for requirements). Low process pressure also helps to minimize charge neutralization. Likewise, tool design permitting, configuration with plate placed above processing plasma would help to alleviate the gravity factor (as shown and discussed later relative to FIG. 8).

The charge on the plate 42, in a plasma vacuum, experience an additional force that is due to the plasma potential gradient in the plasma/plate interface dark space and allows for stronger repel force in addition to the electrostatic force from RF self-biasing. Both components of forces are proportional to the respective electric potential gradient:

$$F = E_{plate} q_{particle} = q_{particle} \frac{dV_{plate}}{dx} \quad \text{Eq (2)}$$

Wherein $dV_{plate}$ is a potential change a distance away from the plate (dx) from substrate electrostatic charging or that from plasma at plasma/substrate dark space, and dx is the change in X of FIG. 4. $dV_{plate}$ is used to reference potential change near the plate, that is, dV, where $V=V_{plate}$ when X=0. The total F from both sources is the force exerted to the particle to pull off from the substrate. In other words, forces from plasma potential gradient at substrate surface add to the force to lift heavier particles. The potential gradient, $dV_{plate}/dx$, at plasma/substrate interface is governed by many factors. It is expected that the higher the self-biasing, the higher the plasma potential difference between interior and that of the said interface; and that determines the total plasma potential changes $\Delta V_{plate}$ over $\Delta X$, sheath thickness. Prior art analytical analysis and data to those experienced in the art suggests that the "$\Delta X$" sheath thickness is relatively insensitive as compared with voltage change. This indicates that increasing self-biasing not only enhances electrostatic particle repulsive force, but also forces by dark space plasma potential gradient. The goal and that which is achieved by the embodiments and method of the present invention is therefore to maximize the self-bias or voltage applied to the plate 42 of FIG. 4, resulting in lifting and moving heavier and more particles and therefore reducing contamination. Essentially, the higher the self biasing, the stronger the total repelling forces on particles, coming from the plasma potential gradient and plate static charge.

Figure 5:
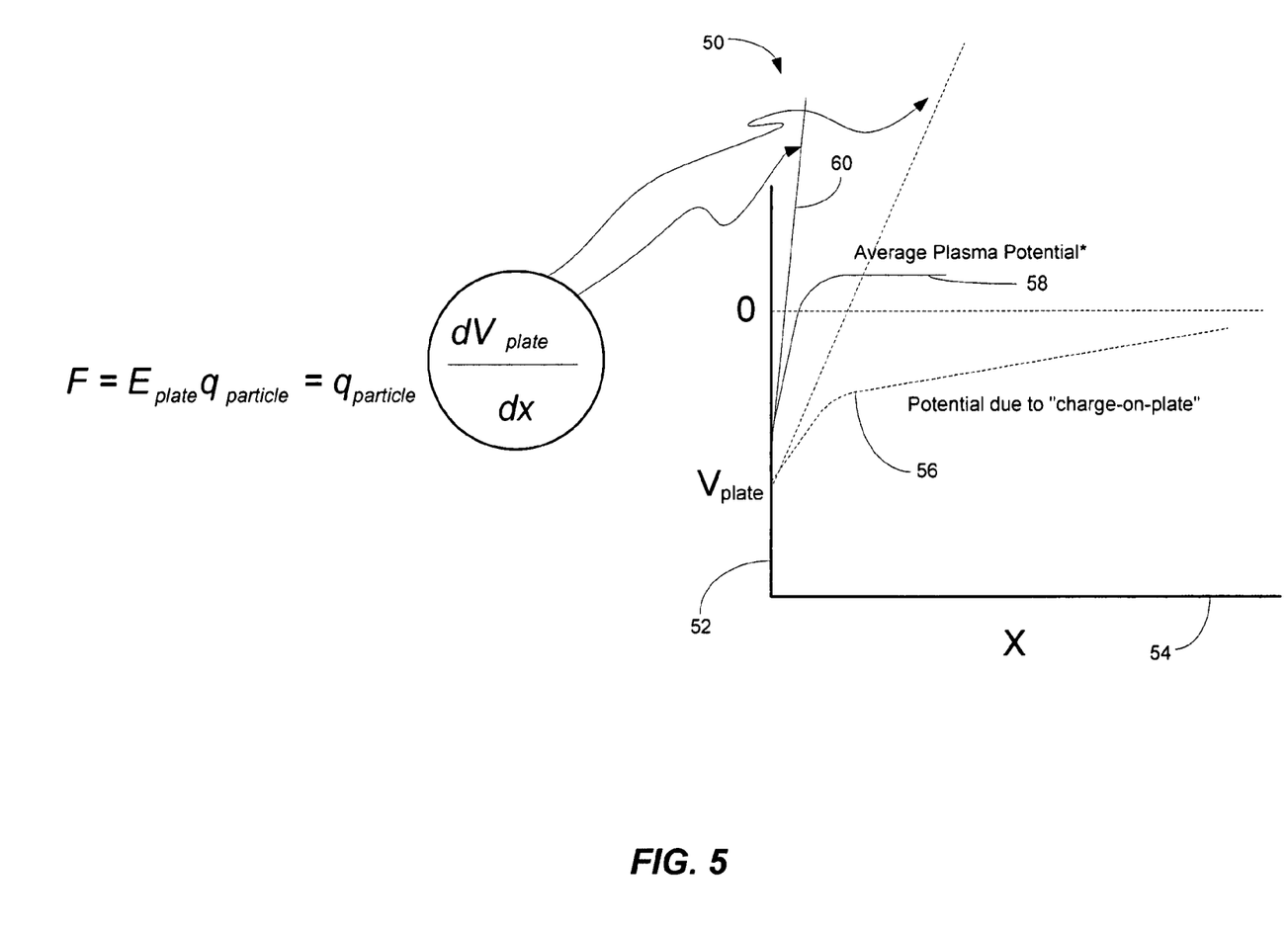
FIG. 5 shows a graph to include a y-axis representing $V_{plate}$ and an x-axis representing the X distance of the particle to the plate of FIG. 4.

Eq (2) above is repeated in FIG. 5 with reference to the graph 50 wherein a graph 50 is shown to include a y-axis 52 representing potential and an x-axis 54 representing the X distance of the particle from the plate 42 of FIG. 4. The potential changes with X as represented by the lines 56 and 58 with the line 56 representing the average potential due to the electrostatic charge on the plate 42 and the line 58 representing that from plasma at substrate interface. Particles due to its relative high mass only respond to the average potential due to high radio frequency (RF).

In the present invention, an RF particle cleaning process step with maximized self-bias is presented. The RF process employs a working gas, preferably an inert gas, when chemical reaction is undesirable. The inert gas is preferably a light atomic mass like He when sputter etch removal is undesired and a heavier atomic mass, such as, Argon (Ar) or Xenon (Xe), when charge injection/plasma damage is undesired. Regardless of the type of working gas, low process pressure (at or less than mTorr level) is preferred to minimize charge neutralization. Such a process step can also be combined with normal Ar pre-etch if its parametrics are not in conflict with particle cleaning.

In one embodiment and method of the present invention, while a wafer is being etched, in a plasma vacuum tool, it undergoes the particle removal or reduction of contamination that is described herein.

Figure 9:
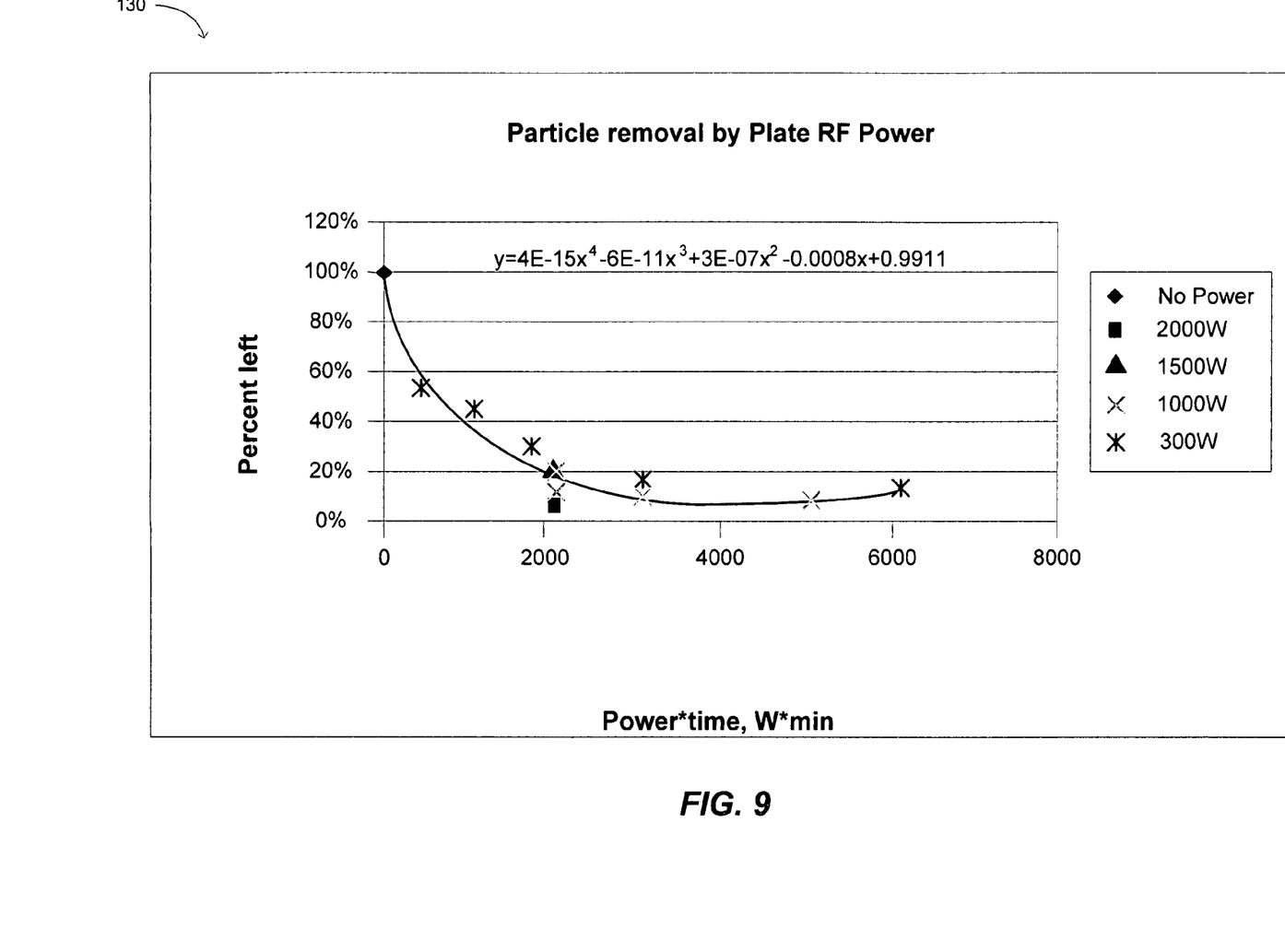
FIG. 9 shows a graph of the percentage of particles remaining (as represented by the y-axis) relative to the product of time and power applied (as represented by the x-axis).

The present invention includes a method of removing particles to reduce contamination on a wafer, or the surface of a substrate, with minimized physical etch removal of the same. To do so, a light inert gas, such as helium (He) is employed with a voltage applied thereto and without bombarding the substrate. Any light inert gas, such as He, may be employed. Alternatively, a heavy gas, such as Xenon, may be employed. In cases where etching is an issue and a reduction or elimination thereof is sought, a lighter inert gas is preferable with a high voltage level applied thereto for removal of the most number of particles. However, when particle cleaning is hindered by particle adherence to the wafer, and when etching is not an issue while ion implantation/plasma damage is to be avoided, a heavier gas may be employed with reduced voltage levels. FIG. 9, shows a case of etching by a heavier gas to help remove additional particles which have "anchored" in some way onto the plate and sputter etch is used to help remove and loosen the "anchor point" so those "anchored" particles are successfully removed.

In general, the level of voltage applied to charge particles is related to the amount of time such voltage is applied. For example, a lower level voltage is applied when such application is for a longer period of time whereas a higher level voltage is applied when such application is for a shorter period of time. A working bias can be employed as low as 20V with high limit governed by tool capability and other concerns such as device plasma damage (ESD). In practicality such bias can rarely exceed 7000V. In certain cases, combining different voltages and decontamination time, different decontamination conditions fit into a single empirical relationship of product of plate RF power and time vs. percent of particle removal, as shown in FIG. 9.

Low pressure is used to ensure maintenance of charge for the removal of particles. High pressure increases the propensity of particle/charge collision and therefore of charge neutralization. Pressure at near vacuum is measured by the number of gas molecules per cubic unit volume. Low pressure reduces the possibility of a particle being hit by another ion, which would otherwise increase the frequency of charge neutralization. The type of gas that is chosen for this process is preferably one effectuating a low process pressure. The pressure is preferably in the milli Torr range. The goal is to minimize the number of atoms in the chamber where the wafer is undergoing particle reduction.

The power and voltage applied for reducing particle contamination is not necessarily that of the power and voltage applied for etching. For reducing particle contamination, in one method, the application of voltage and power is maximized with a limit only as to how much the tool in which the wafer resides and the wafer itself is deemed desirable and in some cases is able to withstand, whereas, for etching, the application of voltage and power is based on the amount of desired etching, etched surface characteristics and its process controllability, etc. If Helium (He) is used as the gas during particle reduction, and the voltage is applied at a high enough level, etching may take place.

Figure 6:
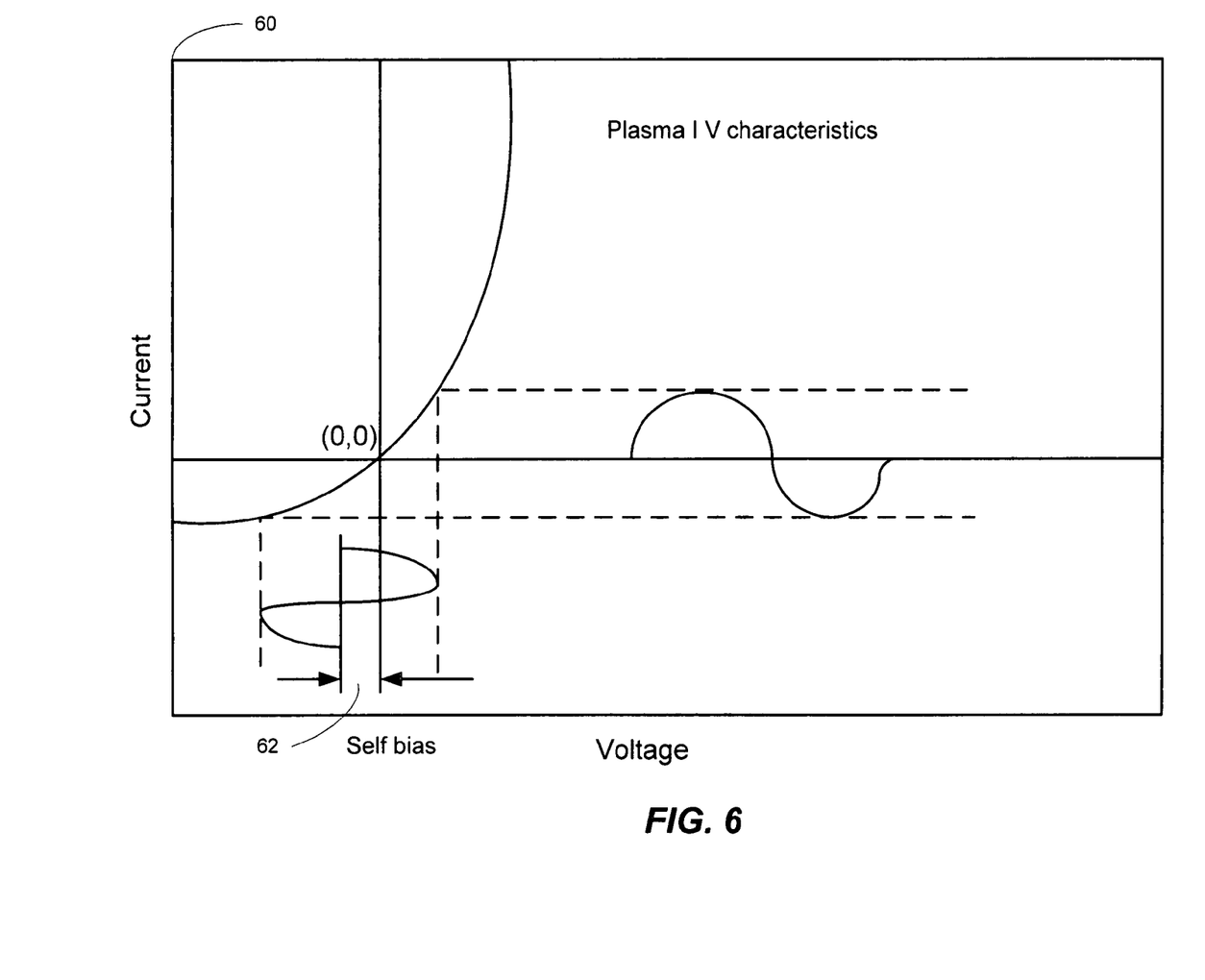
FIG. 6 shows a graph showing a voltage-current relationship exhibiting a self-biasing voltage in an RF vacuum plasma system.

FIG. 6 shows a graph 60 showing plasma IV characteristics using a voltage-current relationship exhibiting a self-biasing voltage 62. Due to electron/ion mass imbalance, electrons are more mobile than ion. This results in a deficit in surface ions under RF condition and the plate surface is then flooded with electrons creating a "self bias" voltage. Due to electron/ion mass imbalance, electrons are more mobile than ions, which results in a deficit in the surface ions under RF condition. The surface of the plate or substrate, such as the plate 42, is then flooded with electrons creating "self bias" voltage, such as the self bias voltage 62.

The method and apparatus of the embodiments of the present invention employ an in-situ particle decontamination technique that allows for such decontamination while a wafer is a vacuum tool or deposition chamber, thereby eliminating the need for another device for performing decontamination and enabling in-situ decontamination of particles generated, for example, by mechanical component of the said vacuum tool. Furthermore, particle decontamination is performed in the presence of plasma, having a potential for helping to maximize a "self bias" voltage, under RF conditions, to further increase particle decontamination. As opposed to prior art techniques, the present invention does not rely on pressure differential, rather, it relies on and operates in a vacuum, which allows for higher charge density related to plasma. That is, in the present invention, plasma potential gradient at the chuck or plate surface to drive charged particles off. Furthermore, in the present invention, RF power, which is alternating current (AC) with very high frequency, is applied and due to its high frequency, a direct current (DC) biasing component is generated (self bias) resulting from electron accumulation due to ion/electron mobility difference, which charges both the substrate (or wafer) and the particle causing contamination and at the same time drives off the same-sign charged particles.

Figure 7:
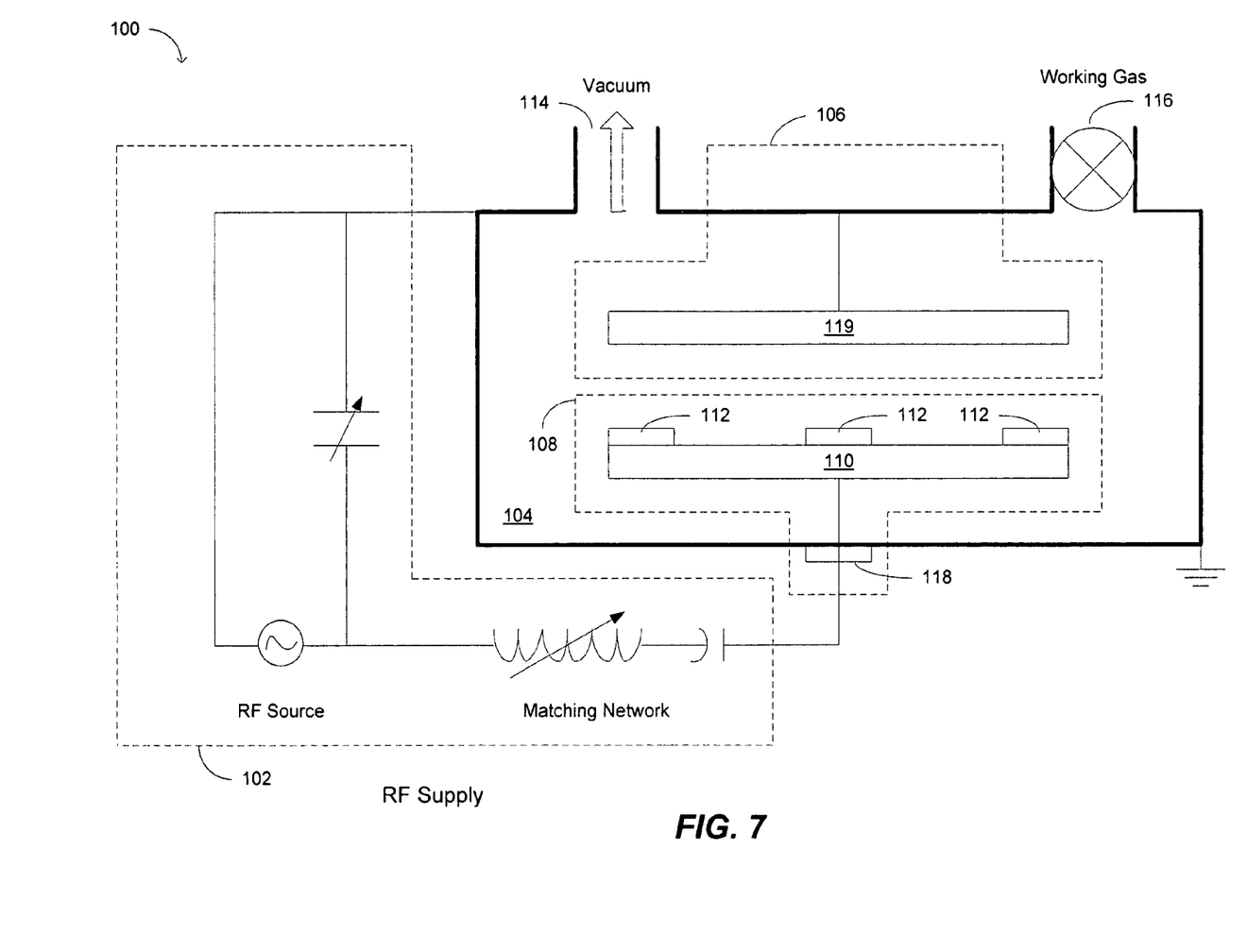
FIG. 7 shows an example wafer chamber system for particle removal in accordance with the methods of the present invention.

FIG. 7 shows an example wafer chamber system 100 for particle removal in accordance with the methods of the present invention. In FIG. 7, there is shown, a vacuum chamber 104 (for vacuum plasma) powered by an RF power supply 102. The chamber 104 is shown to include a vacuum outlet 114 and a working gas inlet 116. A series of vacuum pumps (not shown) is typically attached to the vacuum 114 to generate vacuum within the chamber 104 by causing an enclosure for insulating vacuum environment from ambient such that the pressure differential, or vacuum, can be generated and maintained within the chamber 104.

Working gas, or inert gas, such as Ar, enters the chamber 104 through the inlet 116. The chamber 104 additionally includes two parts, one is the target assembly (or structure) 106 for deposition and the other is the wafer structure 108. The structure 106 is shown to include an electrode 119, commonly referred to as a cathode, which is negatively energized and self-biased during a deposition process but during etching and that which is described relative to preceding figures of the present invention, is not energized.

The structure 108 is shown to include a plate 110, which is powered or energized, by the supply 102 during operation and has resting upon it, the wafer 112 from which particles are removed in accordance with the process discussed hereinabove relative to previous figures. An insulator 118 is generally an electrical insulator serving to insulate the plate 110, when the plate 110 is powered, from the chamber 104, as the latter is grounded. Thus, in operation, power from the supply 102 is applied to the plate 110 to ignite and sustain plasma. Due to the characteristics of RF plasma, the impedance of the RF source is not matched to that of the plasma and therefore, a matching network is included in the supply 102, as shown in FIG. 7, and serves to match impedance in both phase and magnitude. When power is supplied to the plate 110, charged particles residing on the wafer 112 are repelled and accordingly removed from the wafer 112. Specifically, the charged particles are repelled by the Coulomb electro-static force and plasma potential gradient. Pressure equilibrium is achieved, within the chamber 104, prior to particle removal and after power is applied thereto and pressure is regulated in accordance with the equation:

$$\lambda = 5 \times 10^{-3}/P \qquad \text{Eq (3)}$$

wherein P is pressure and set to values where $\lambda$ is on the same order of diameter of the chamber 104 according Eq. 3. For typical vacuum chambers, low process pressure (at or less than mTorr level) is preferred to minimize charge neutralization.

Typically, a voltage to charge the wafer 112, in the range of 20 to 7000V, is applied by the RF supply.

Figure 8:
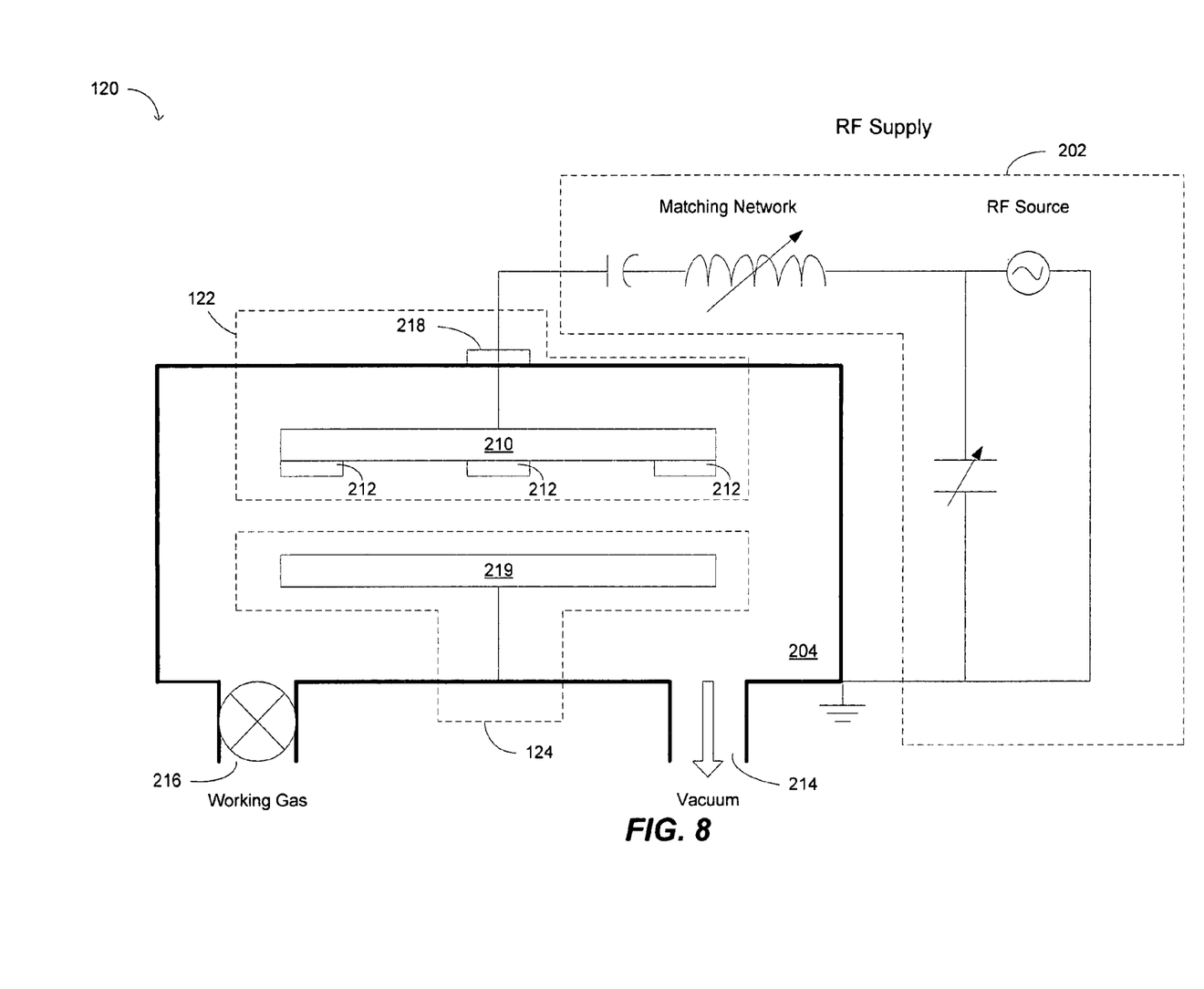
FIG. 8 shows another example wafer chamber system for particle removal in accordance with an embodiment of the present invention.

In the system 100, when power is disconnected, the still-suspended particles that are lifted or removed from the wafer 112 during operation fall back onto the wafer 112 due to the effects of gravity. In FIG. 8, being that the plate 110 is upside down, gravity is alleviated as an unfavorable factor for particle removal.

FIG. 8 shows another example wafer chamber system 120 for particle removal in accordance with an embodiment of the present invention. In FIG. 8, similar structures are shown as that of FIG. 7 with different configuration. That is, the deposition assembly 124 and the plate assembly 122 are shown upside down relative to their counterparts in FIG. 7. As earlier noted, this type of arrangement avoids undesirable particles to land back by gravity onto the wafer 112 (in FIG. 7 and 212 in FIG. 8) after power is disconnected.

In FIG. 8, the wafer chamber system 120 is shown to include a vacuum chamber 204 (for vacuum plasma) powered by an RF power supply 202. The chamber 204 is shown to include a vacuum outlet 114 and a working gas inlet 116. A series of vacuum pumps (not shown) is typically attached to the vacuum 214 to generate vacuum within the chamber 204 by causing an enclosure for insulating vacuum environment from ambient such that the pressure differential, or vacuum, can be generated and maintained within the chamber 204.

Working gas, or inert gas, such as Ar, enters the chamber 204 through the inlet 216. The chamber 204 additionally includes two parts, one is the target assembly for deposition 124 and the other is the wafer structure 122. The structure 124 is shown to include an electrode 219, commonly referred to as a cathode, which is negatively energized and self-biased during a deposition process but during etching and that which is described relative to preceding figures of the present invention, it is not energized.

The structure 122 is shown to include a plate 210, which is powered or energized, by the supply 202 during operation and has resting upon it, the wafer 212 from which particles are removed in accordance with the process discussed hereinabove relative to previous figures. An insulator 218 is generally an electrical insulator serving to insulate the plate 210, when the plate 210 is powered, from the chamber 204, as the latter is grounded. Thus, in operation, power from the supply 202 is applied to the plate 210 to ignite and sustain plasma. Due to the characteristics of RF plasma, the impedance of the RF source is not matched to that of the plasma and therefore, a matching network is included in the supply 202, as shown in FIG. 8, and serves to match impedance in both phase and magnitude. When power is supplied to the plate 210, charged particles residing on the wafer 212 are repelled and accordingly removed from the wafer 212. Specifically, the charged particles are repelled by the Coulomb electro-static force and plasma potential gradient. Pressure equilibrium is achieved, within the chamber 204, prior to particle removal and after power is applied thereto and pressure is regulated in accordance with the Eq. (3), hereinabove.

As the deposition assembly 124 and the plate assembly 122, in FIG. 8, are shown upside down relative to their counterparts in FIG. 7, this type of arrangement avoids undesirable particles landing back, by gravity, onto the wafer 212 after power is disconnected.

In another embodiment, FIG. 9 shows a graph 130 of the percentage of particles remaining (as represented by the y-axis) relative to the product of power and time applied (as represented by the x-axis) when the methods of the present invention using Ar are employed. Clearly, the larger the product of power and time, the less undesirable particles remain. This is to be expected if the electro-static and plasma potential are not sufficient to remove all particles and a portion of remaining particle are "anchored" in some way to the surface. Sputter etch helps to remove and weaken those "anchor points" or in general provides additional energy to overcome the energy barrier for particle removal from the surface. "Power*time" is well known to the prior art to be proportional to etch stock removal or in general as "energy input". Nanometer scale stock removal may not alter mass much with particle of micrometer scale, but may remove points that particles adhere to the wafer surface. While explaining the precise mechanism behind FIG. 9 is not the goal of this invention, making use of it is. That is, 28 and 30 and 38 and 40 in FIGS. 2 and 3 can further be reduced if additional exposure to time is increased.

It should be noted that while the present invention is described in an RF diode configuration processing chamber, its processing principle can be slightly modified and applied readily to other vacuum process configurations by those skilled in the art.

While examples given are severe cases for illustration purposes, it is expected that present invention would work on all levels of particles contamination not just severe cases as used herein Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention

What is claimed is:

1. A method of loose particle decontamination of the surface of a wafer that is in a wafer chamber system having a vacuum chamber comprising:

applying power to a plate on top of which is a wafer in a plasma vacuum, the application of power causing igniting and sustaining of plasma, the wafer having loose particles residing thereon;

in-situ, charging the loose particles that contaminate the surface of the wafer with a predetermined charge;

selectively applying to the wafer a light atomic mass inert gas or applying to the wafer an insert heavy atomic mass gas;

achieving pressure equilibrium within the vacuum chamber prior to loose particle removal; and repelling the loose particles from the wafer surface by electrostatic interaction between the loose particles and the wafer surface while maintaining pressure equilibrium.

2. The method of loose particle decontamination, as recited in claim 1, wherein the power applied includes radio frequency (RF) power.

3. The method of loose particle decontamination, as recited in claim 1, wherein the wafer resides on a plate and further including the step of flooding the surface of the plate with electrons to create a "self-bias" voltage.

4. The method of loose particle decontamination, as recited in claim 3, further including maximizing the self-bias voltage applied to the surface of the plate to maximize plasma potential and repulsive force.

5. The method of loose particle decontamination, as recited in claim 3, wherein additional particle repulsive plasma electrostatic forces are from plasma potential gradient, wherein a plasma electrostatic force, plasma F, is defined by $E_{plate}$ times $q_{particle}$ wherein $q_{particle}$ represents particle charge from plasma self-bias voltage and $E_{plate}$ represents the plasma electric field.

6. The method of loose particle decontamination, as recited in claim 1, wherein the charging of the wafer step includes applying a voltage to the wafer in the range of 20 to 7000V.

7. The method of loose particle decontamination, as recited in claim 1, wherein the charging of the particle step includes applying a voltage to the particle in the range of 20 to 7000V.

8. The method of loose particle decontamination, as recited in claim 1, wherein the light inert gas is He when sputter etch removal is undesirable.

9. A method of particle decontamination, as recited in claim 1, wherein the heavy inert gas is from a group consisting of Argon (Ar) and Xenon (Xe).

10. The method of loose particle decontamination, as recited in claim 1, further including employing a process pressure in the range of 0.01 to 1,000 millitorr.

11. The method of loose particle decontamination, as recited in claim 1, further including applying process pressure being in the range of 0.01 to 1,000 millitorr to minimize charge neutralization and increase particle decontamination.

12. The method of loose particle decontamination, as recited in claim 1, further including the step of regulating pressure of the chamber while power is applied.

* * * * *